US011574828B2

(12) United States Patent
Kang

(10) Patent No.: US 11,574,828 B2
(45) Date of Patent: Feb. 7, 2023

(54) SUBSTRATE PROCESSING APPARATUS, INFORMATION PROCESSING APPARATUS, AND INFORMATION PROCESSING METHOD

(71) Applicant: Tokyo Electron Limited, Tokyo (JP)

(72) Inventor: Youngtai Kang, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 160 days.

(21) Appl. No.: 16/925,427

(22) Filed: Jul. 10, 2020

(65) Prior Publication Data

US 2021/0020479 A1 Jan. 21, 2021

(30) Foreign Application Priority Data

Jul. 17, 2019 (JP) .............................. JP2019-132261

(51) Int. Cl.
*H01L 21/67* (2006.01)
*H01L 21/66* (2006.01)
*G05B 13/02* (2006.01)

(52) U.S. Cl.
CPC ...... *H01L 21/67253* (2013.01); *G05B 13/021* (2013.01); *H01L 22/12* (2013.01); *H01L 22/20* (2013.01); *H01L 21/67098* (2013.01)

(58) Field of Classification Search
CPC ............ G05B 13/021; H01L 21/67098; H01L 21/67253; H01L 21/67309; H01L 22/12; H01L 22/20

USPC ......................................................... 702/97
See application file for complete search history.

(56) References Cited

U.S. PATENT DOCUMENTS

2008/0086228 A1* 4/2008 Yamaji ................ G05B 13/021
700/109

FOREIGN PATENT DOCUMENTS

JP 2008-091826 A 4/2008

* cited by examiner

*Primary Examiner* — John H Le
(74) *Attorney, Agent, or Firm* — Venjuris, P.C.

(57) ABSTRACT

A substrate processing apparatus that accommodates a substrate holder in which a substrate is placed in a processing container and forms a film onto the substrate, includes: a film thickness meter that measures a thickness of the film formed on the substrate; a state analysis unit that analyzes variation of the film thickness from a measurement result output from the film thickness meter at a plurality of measurement points where the film thickness on the substrate is measured; a singular point detection unit that, based on the analysis result, detects a measurement point where a difference from an adjacent measurement point deviates from a predetermined condition, as a singular point; and a singular point correction unit that corrects a measurement result of the singular point so that the difference of the film thickness between the singular point and the adjacent measurement point is within a predetermined condition.

13 Claims, 12 Drawing Sheets

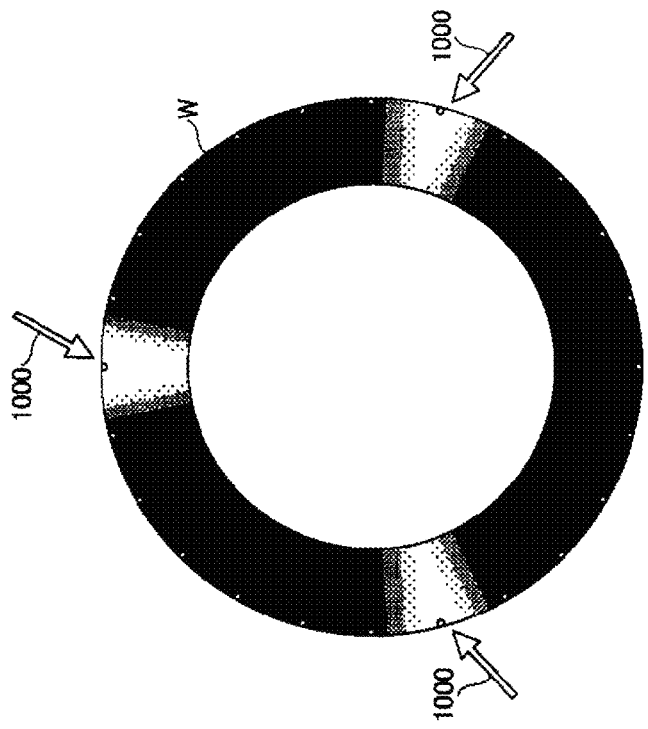
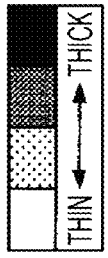
FIG. 3A
EXAMPLE THAT IS NOT NECESSARY TO EXCLUDE INFLUENCE OF CLAW
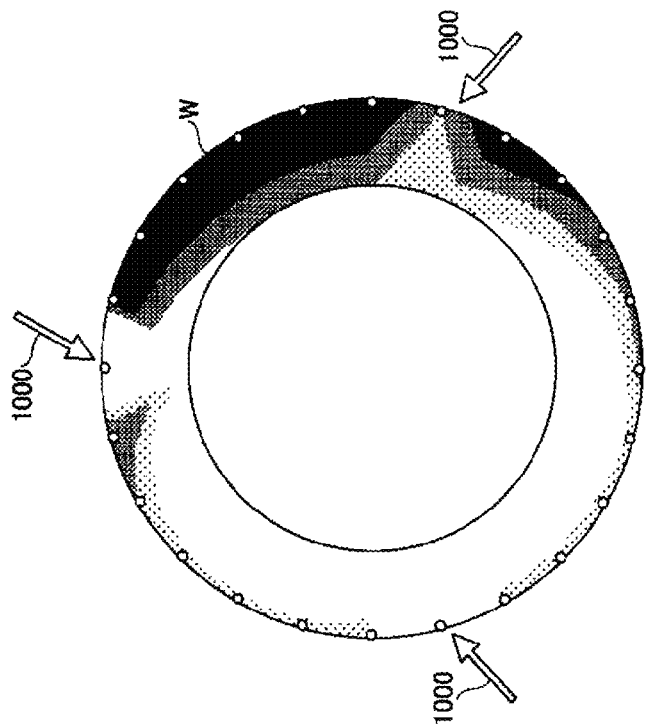
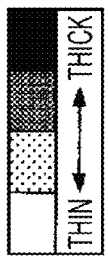
FIG. 3B
EXAMPLE THAT IS NECESSARY TO EXCLUDE INFLUENCE OF CLAW

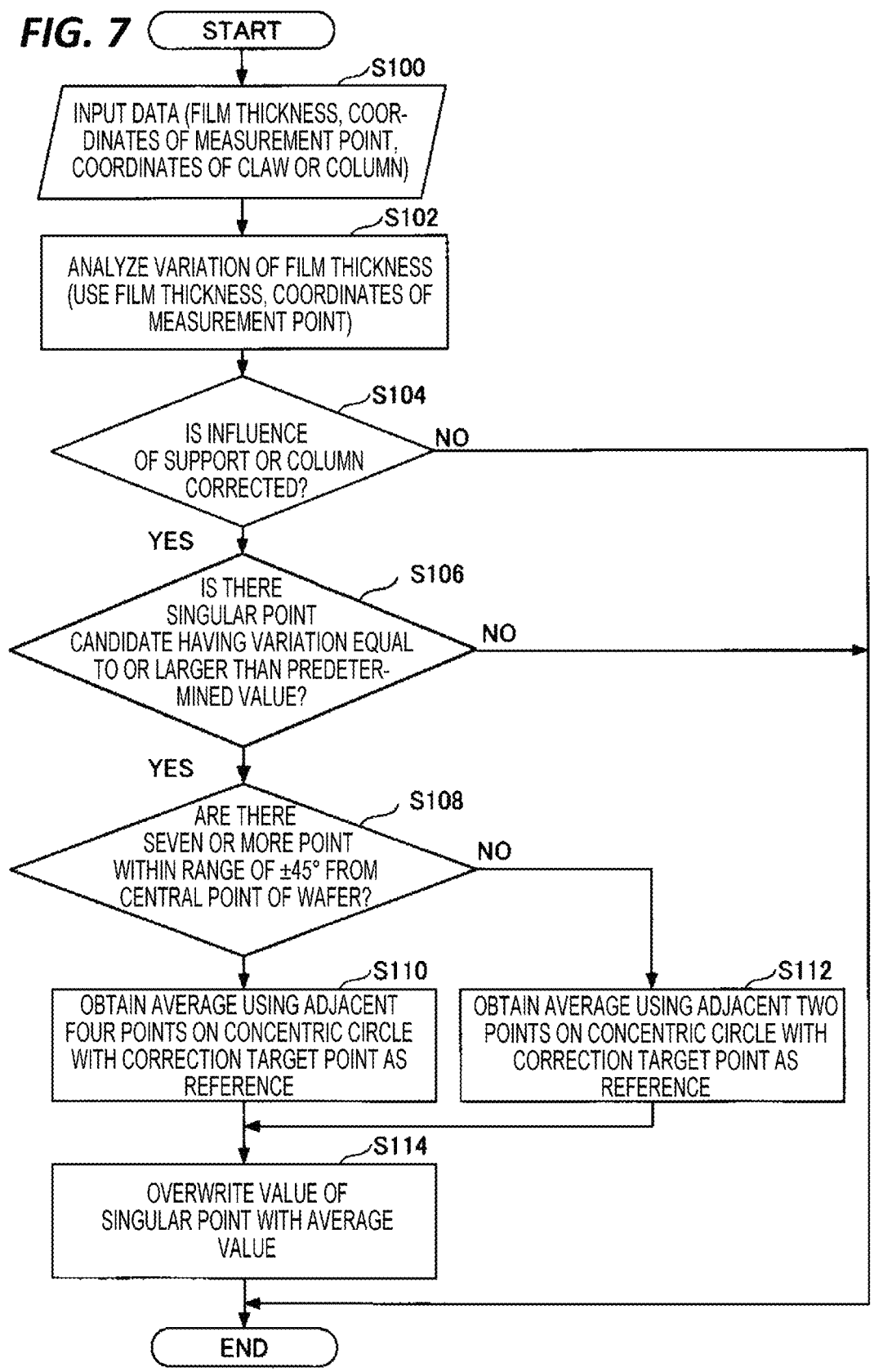

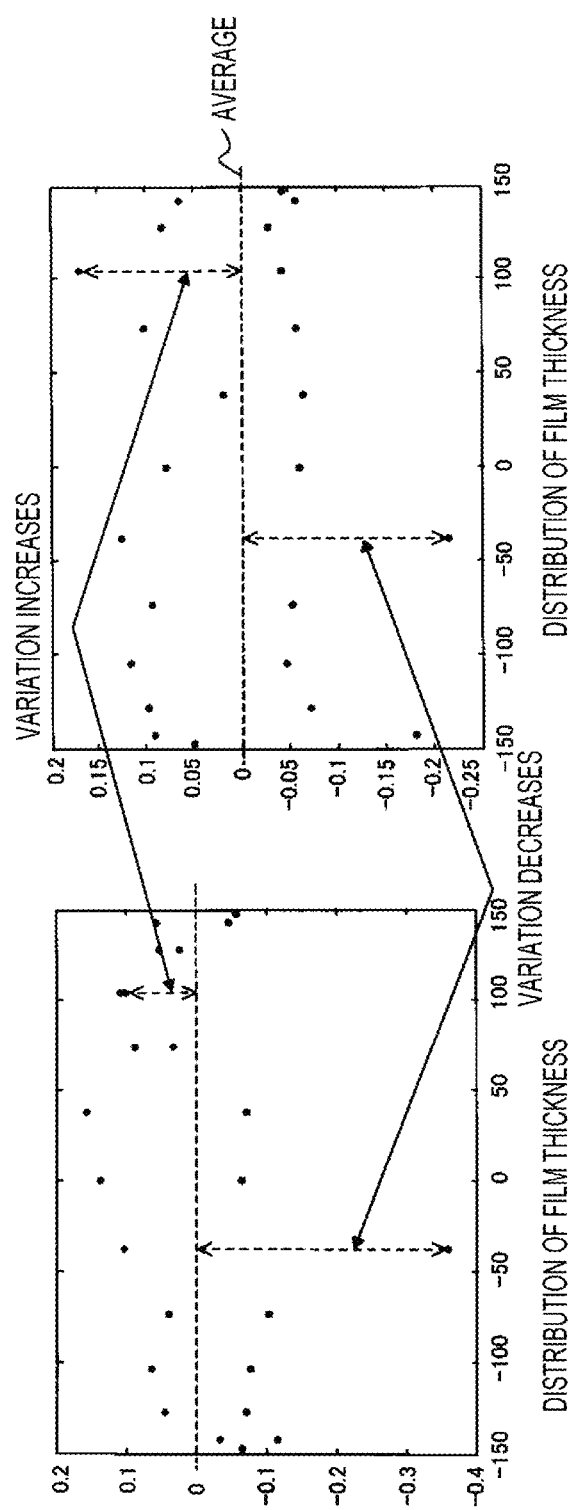

SUBSTRATE PROCESSING APPARATUS, INFORMATION PROCESSING APPARATUS, AND INFORMATION PROCESSING METHOD

CROSS-REFERENCE TO RELATED APPLICATIONS

This application is based on and claims priority from Japanese Patent Application No. 2019-132261 filed on Jul. 17, 2019 with the Japan Patent Office, the disclosure of which is incorporated herein in its entirety by reference.

TECHNICAL FIELD

The present disclosure relates to a substrate processing apparatus, an information processing apparatus, and an information processing method.

BACKGROUND

In manufacturing semiconductor devices, various processing apparatuses are used for processings such as film formation, diffusion, annealing, and etching on a substrate. As for such a substrate processing apparatus, there is a heat treatment apparatus that forms a thin film such as an oxide film on a substrate by performing a heat treatment on the substrate.

For example, in a vertical type heat treatment apparatus including a vertical type heat treatment furnace, a plurality of substrates is held in a shelf shape of a substrate holder called a wafer boat, and the wafer boat is carried into the heat treatment furnace to perform a film forming processing. However, the film forming processing on the substrate is performed based on a processing recipe (a set value of processing parameters) including processing conditions such as a pressure, a heater temperature, and a gas flow rate according to, for example, a kind of thin film to be formed or a film thickness, or the like.

The processing recipe is optimized by repeating an operation of adjusting the processing recipe while performing the film forming processing with the wafer boat fully loaded with substrates for adjusting. In the optimization processing of the processing recipe, the film thickness of the thin film formed on the substrate is measured by a film thickness measuring device, and the processing recipe is adjusted so that a difference between the measured film thickness of the measured film thickness data and a target film thickness is eliminated (see, e.g., Japanese Patent Laid-Open No. 2008-091826).

SUMMARY

An aspect of the present disclosure is a substrate processing apparatus that accommodates a substrate holder in which a substrate is placed in a processing container and forms a film onto the substrate, including: a film thickness meter that measures a thickness of the formed film; a state analysis unit that analyzes variation of a film thickness from a measurement result output from the film thickness meter at a plurality of measurement points where the film thickness on the substrate is measured; a singular point detection unit that, based on the analysis result of the state analysis unit, detects a measurement point where a difference from another adjacent measurement point deviates from a predetermined condition as a singular point; and a singular point correction unit that corrects a measurement result of the singular point so that the difference between the measurement result of the singular point and a measurement result of another measurement point adjacent to the singular point is within a predetermined condition.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 3A and 3B are views illustrating an example of a wafer W having a thin film thickness in the vicinity of a column and a support.

FIG. 7 is a flow chart of an example of a processing in which a singular point due to an influence of a column and a support is detected, and the singular point is corrected.

FIGS. 9A and 9B are views for explaining an example of a variation analysis of a film thickness.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, an embodiment for implementing the present disclosure will be described with reference to the drawings.

[Substrate Processing Apparatus]

Descriptions will be made on a substrate processing apparatus to which a singular point detection and correction algorithm for a wafer film thickness according to an embodiment of the present disclosure may be appropriately applied.

Figure 1:
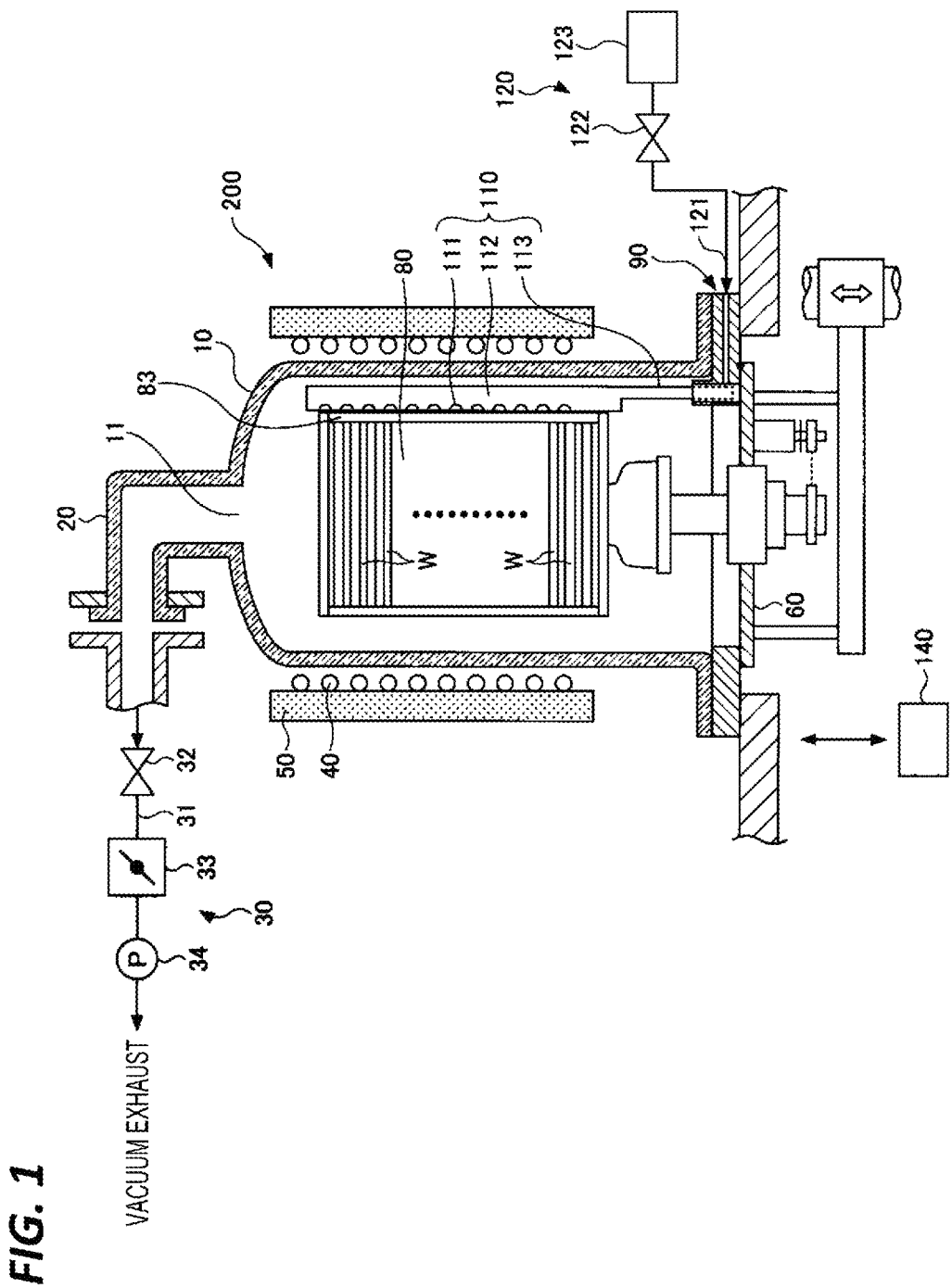
FIG. 1 is a schematic view of an example of a substrate processing apparatus.

FIG. 1 is a schematic view of an example of a substrate processing apparatus. As illustrated in FIG. 1, the substrate processing apparatus includes a heat treatment furnace 10 capable of accommodating a plurality of semiconductor wafers (hereinafter, referred to as "wafer W"). The heat treatment furnace 10 is a processing container for accommodating and processing a wafer W. The heat treatment furnace 10 is formed of quartz having high heat resistance into a substantially cylindrical body shape, and has an exhaust port 11 on the ceiling. The heat treatment furnace 10 is configured in a vertical shape extending in a vertical (up and down) direction. The diameter of the heat treatment furnace 10 is set in a range of about 350 mm to 450 mm, for example, when the diameter of the wafer W is 300 mm A gas exhaust port 20 is connected to the exhaust port 11 in the ceiling portion of the heat treatment furnace 10.

The gas exhaust port 20 is configured as, for example, a quartz pipe extending from the exhaust port 11 and bent at a right angle into an L shape. A vacuum exhaust system 30 that exhausts the atmosphere in the heat treatment furnace 10 is connected to the gas exhaust port 20. Specifically, the vacuum exhaust system 30 includes a metal gas exhaust pipe 31 made of, for example, stainless steel, which is connected to the gas exhaust port 20. Further, an opening/closing valve 32, a pressure adjusting valve 33 such as a butterfly valve, and a vacuum pump 34 are sequentially provided in the gas exhaust pipe 31, so that a vacuum state can be caused while adjusting the pressure in the heat treatment furnace 10. The inner diameter of the gas exhaust port 20 is set to be equal to the inner diameter of the gas exhaust pipe 31.

A heater 40 is provided on a side portion of the heat treatment furnace 10 to surround the heat treatment furnace 10, so that the wafer W accommodated in the heat treatment furnace 10 may be heated. The heater 40 is, for example, divided into a plurality of zones, and is constituted by a plurality of heaters (not illustrated) whose heating amount may be independently controlled from the upper side to the lower side in the vertical direction. The heater 40 may be not divided into a plurality of zones, and be constituted by one heater. Further, an insulating material 50 is provided on the outer periphery of the heater 40, so that thermal stability is secured. A lower end portion of the heat treatment furnace 10 is opened, so that the wafer W may be carried into/out. An opening in the lower end portion of the heat treatment furnace 10 is configured to be opened/closed by a cover 60.

A wafer boat 80 is provided above the cover 60. The wafer boat 80 is a substrate holder configured to hold the wafer W, and is capable of holding a plurality of wafers W in multiple stages at an interval in the vertical direction. The number of wafers W held by the wafer boat 80 is not particularly limited, but may be 50 to 150.

Figure 2:
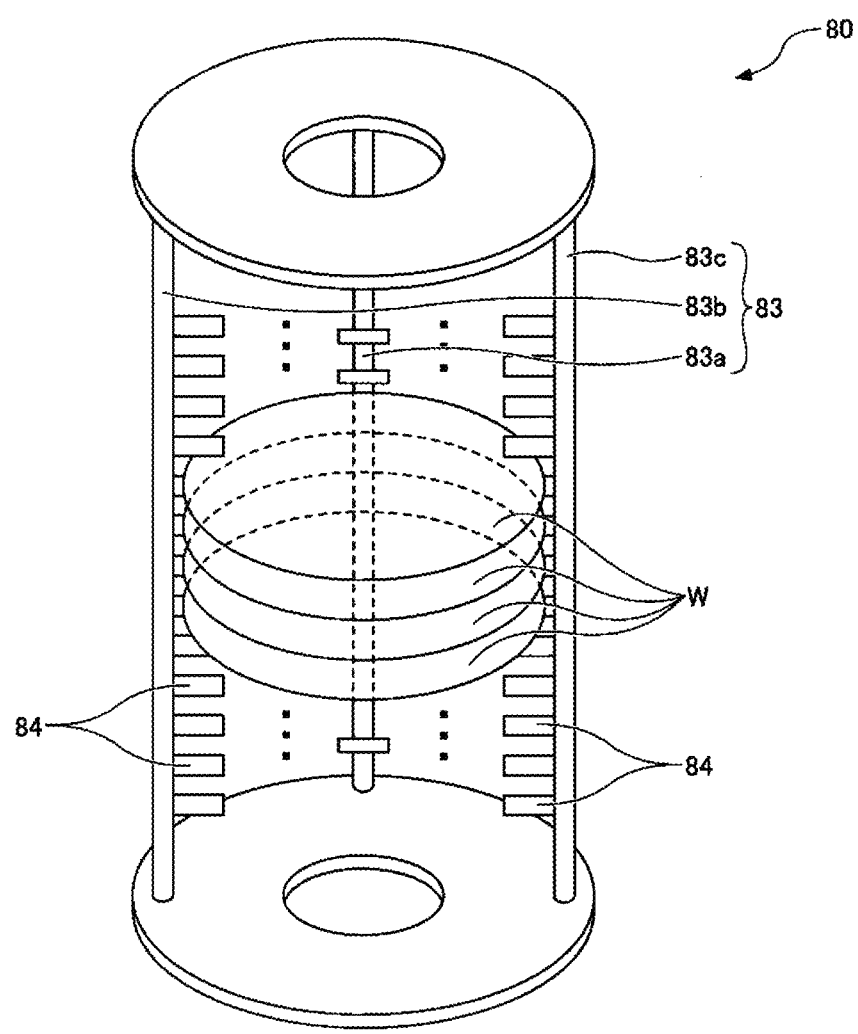
FIG. 2 is a view illustrating an example of a wafer boat usable in the substrate processing apparatus.

Next, descriptions will be mad on an example of the wafer boat 80 used in the substrate processing apparatus with reference to FIG. 2. FIG. 2 is a view illustrating an example of the wafer boat 80 usable in the substrate processing apparatus.

As illustrated in FIG. 2, the wafer boat 80 includes a top plate and a bottom plate, and a column 83 between the top plate and the bottom plate. FIG. 2 illustrates an example provided with three columns 83. The number of columns 83 may be variously set depending on the application as long as it is three or more, and for example, the number of columns may be four.

Each of the columns 83 has supports 84 formed with a predetermined interval in the vertical direction. Since the support 84 has a small flat plate shape and protrude inward like a claw, they may be called a claw. The interval between the supports 84 may be appropriately set depending on the application, but as described above, for example, may be set as an interval such that 50 to 150 wafers W may be placed on one wafer boat 80. The support 84 may have any shape as long as they are capable of supporting the wafer W, but, for example, may be formed in a rectangular shape having a horizontal plane extending in the central direction. The supports 84 of each of the columns 83 are set to have the same height as the respective supports 84 that support the same wafer W such that the wafer W is supported in the horizontal state. Further, when the number of columns 83 is three, one column 83a is disposed on the inner side of the center when viewed from the front side on which the wafer W is mounted, and the other two columns 83b and 83c are disposed symmetrically with respect to the column 83a.

A manifold 90 having a portion extending along an inner peripheral wall of the heat treatment furnace 10, and a flange portion extending outward in the radial direction are disposed in the heat treatment furnace 10. In the heat treatment furnace 10, a necessary gas is introduced into the heat treatment furnace 10 from the lower end portion of the heat treatment furnace 10 via the manifold 90. The manifold 90 is configured as a separate component from the heat treatment furnace 10, but is provided integrally with the side wall of the heat treatment furnace 10 and constitutes a part of the side wall of the heat treatment furnace 10.

The manifold 90 supports an injector 110. The injector 110 is a tubular member configured to supply a gas into the heat treatment furnace 10, and is made of, for example, quartz. The injector 110 is provided to extend in the vertical direction in the heat treatment furnace 10. A plurality of gas ejecting holes 111 is formed in the injector 110 at a predetermined interval along the longitudinal direction, and a gas may be ejected in the horizontal direction from the gas ejecting holes 111. In FIG. 1, one injector 110 is illustrated, but a plurality of injectors 110 may be provided depending on the type of the supplied processing gas, or the position, or the like.

A gas supply pipe 121 is connected to the outer portion of the manifold 90. The gas supply pipe 121 is connected to a gas supply source 123. The gas supply source 123 supplies the processing gas into the heat treatment furnace 10 and stores the processing gas used to perform heat treatment such as film formation on the wafer W. A flow rate control valve 122 is provided in the gas supply pipe 121, and adjusts the flow rate of the processing gas supplied to the heat treatment furnace 10. A mass flow controller may be used as the flow rate control valve 122.

The heat treatment furnace 10 is provided on a base plate 130 that constitutes a ceiling surface of a load-lock chamber. The load-lock chamber is a standby chamber for a wafer where the pressure may be adjusted to a vacuum or an atmosphere pressure, and the heat treatment furnace 10 is provided on the ceiling surface of the load-lock chamber. A controller 140 is an arithmetic processing unit configured to control the operation of the entire substrate processing apparatus, and may be configured by, for example, a computer.

In the substrate processing apparatus having the above described configuration, when performing the film formation, the wafer W is transferred on the wafer boat 80 placed on the cover 60, and the cover 60 is moved up to be accommodated in the heat treatment furnace 10. Then, the processing gas is supplied from the injector 110 and heated by the heater 40, and the heat treatment is performed while rotating the wafer boat 80 to perform the film formation on the wafer W.

When performing the film formation, the film formation may be further performed on the wafer W having an underlying oxide film on the surface. Even when forming the underlying oxide film, the film forming processing is often performed using the substrate processing apparatus.

Here, as illustrated in FIG. 2, the wafer boat 80 includes the column 83 and the supports 84. The portions where the column 83 and the supports 84 are provided become a barrier when the processing gas reaches the surface of the wafer W. That is, since the injector 110 is provided outside the wafer boat 80, the column 83 and the supports 84 are provided so as to hide the wafer W from the processing gas supplied from the injector 110. As described above, it is difficult for the processing gas to reach the vicinity of the column 83 and the supports 84, and thus, as illustrated in FIGS. 3A and 3B, the phenomenon that the film thickness becomes thin easily occurs.

FIGS. 3A and 3B are views illustrating an example of the wafer W having a thin film thickness in the vicinity of the column and the support. Arrows 1000 in FIGS. 3A and 3B indicate portions where the film thickness becomes thin due to the influence of the columns 83 and the support 84. FIG. 3A illustrates an example where the film thickness states of the portion affected by the column 83 and the support 84 and the portion that is not affected are not extremely different from each other, and thus, illustrates an example where it is not necessary to exclude the influence of the column 83 and the support 84. Further, FIG. 3B illustrates an example where the film thickness states of the portion affected by the column 83 and the support 84 and the portion that is not affected are extremely different from each other, and thus, illustrates an example where it is necessary to exclude the influence of the column 83 and the support 84.

As in the vicinity of the column 83 and the support 84 in FIG. 3B, in the case of the wafer W having a portion where the film thickness is greatly different from the surroundings (a singular point), the singular point greatly affects when calculating overall in-plane uniformity, and the in-plane uniformity is decreased. Further, also when further performing the film formation on the underlying oxide film having the singular point, the singular point in the underlying oxide film greatly affects when calculating the overall in-plane uniformity, and the in-plane uniformity is decreased.

In the embodiment, the singular point in the wafer W may be detected and the singular point may be corrected by using a singular point detection and correction algorithm for a wafer film thickness (to be described later). The singular point detection and correction algorithm for the wafer film thickness according to the embodiment may detect and corrects the singular point (a deviated value) so that data analysis or optimization calculation such as calculation of the overall in-plane uniformity is not adversely affected.

[Information Processing System in which Singular Point Detection and Correction Algorithm for Wafer Film Thickness is Executed]

Figure 4:
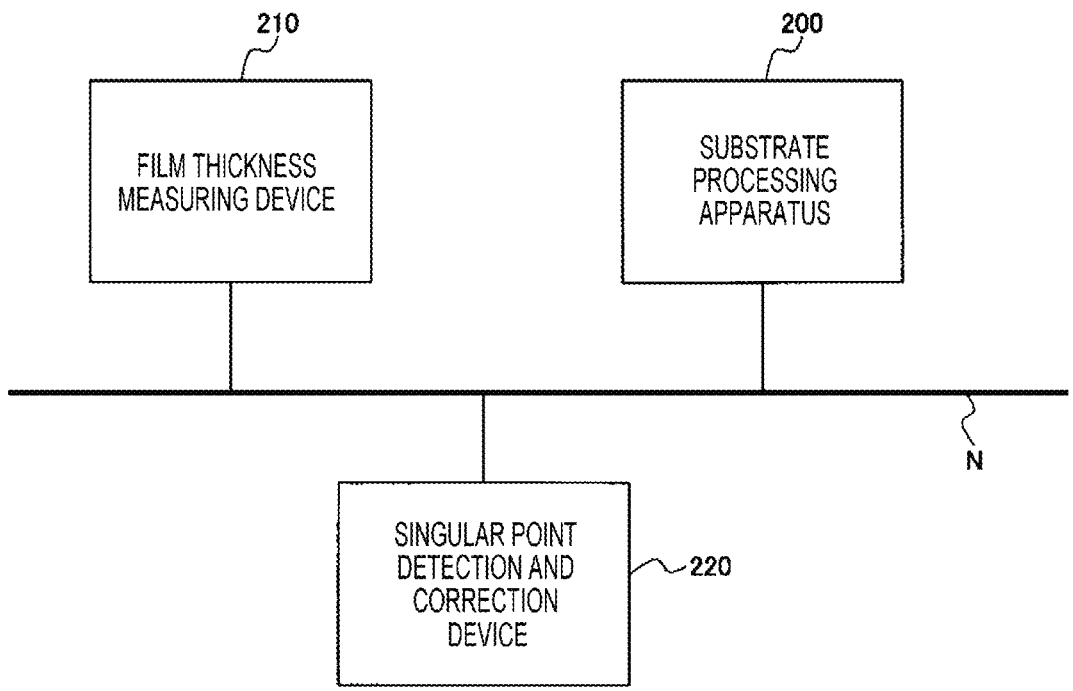
FIG. 4 is a configuration view of an example of an information processing system according to the present embodiment.

FIG. 4 is a configuration view of an example of an information processing system according to the embodiment. In the information processing system illustrated in FIG. 4, a substrate processing apparatus 200, a film thickness measuring device 210, and a singular point detection and correction device 220 are connected with each other via a communication network N such as the Internet or LAN so that data communication is possible. The information processing system in FIG. 4 is an example, and data may be moved via a storage medium such as a USB instead of the network N.

As described with reference to FIGS. 1 and 2, in the substrate processing apparatus 200, the wafer boat 80 in which the wafer W is placed is accommodated into the heat treatment furnace 10, and the film formation is performed on the wafer W. The film thickness measuring device 210 measures the film thickness of a measurement point of a monitor wafer among the wafers W on which a film is formed by the substrate processing apparatus 200. A measurement result of the film thicknesses of the measurement point of the monitor wafer by the film thickness measuring device 210 is input to the singular point detection and correction device 220 automatically or in accordance with an operation of an operator.

The singular point detection and correction device 220 is an information processing device in which a program of the singular point detection and correction algorithm for the wafer film thickness is executed. The singular point detection and correction device 220 detects the singular point on the wafer W and corrects a measurement result of the film thickness of the singular point as will be described later, using, for example, the measurement result of the input film thickness and coordinates of the singular point.

The information processing system in FIG. 4 is an example, and the substrate processing apparatus 200 and the singular point detection and correction device 220 may be integrated. Further, an information processing system in which the singular point detection and correction device 220 is functionally divided into a plurality of devices may be used.

[Hardware Configuration]

Figure 5:
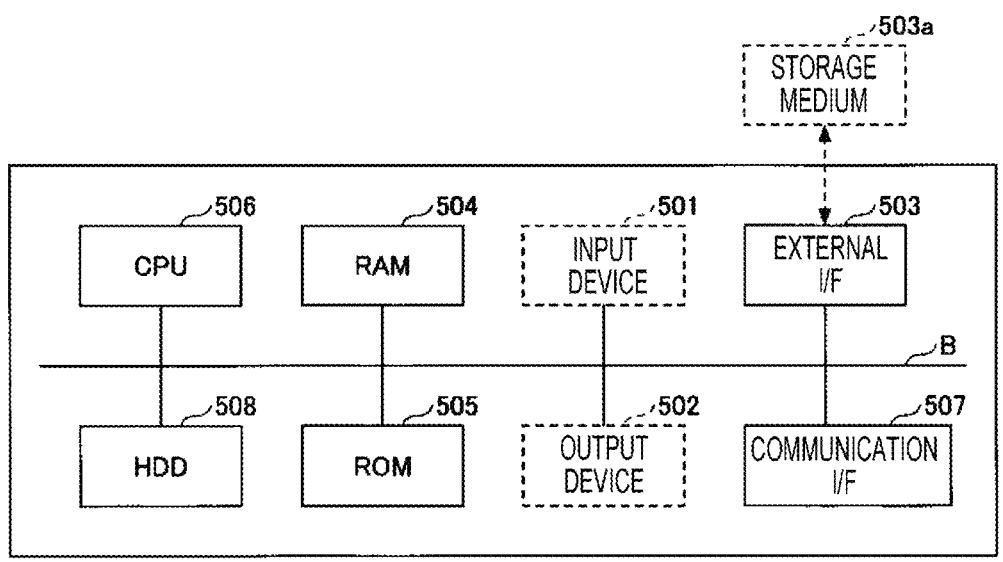
FIG. 5 is a hardware configuration view of an example of a computer according to the present embodiment.

The singular point detection and correction device 220 in FIG. 4 is implemented by, for example, a computer having a hardware configuration illustrated in FIG. 5. FIG. 5 is a hardware configuration view of an example of a computer according to the embodiment.

The computer in FIG. 5 includes, for example, an input device 501, an output device 502, an external OF 503, a RAM 504, a ROM 505, a CPU 506, a communication OF 507, and a HDD 508, which are connected with each other via a bus B. The input device 501 and the output device 502 may connected to use when necessary.

The input device 501 may be, for example, a touch panel used for input, operation keys or buttons, a keyboard, and a mouse. The output device 502 is constituted by, for example, a display such as a liquid crystal or an organic EL that displays a screen and a speaker that outputs sound data such as voice or music. The communication OF 507 is an interface that connects the computer to the communication network N. The HDD 508 is an example of a non-volatile storage device that stores a program or data. A drive device (e.g., a solid state drive (SSD)) that uses a flash memory may be used instead of the HDD 508.

The external I/F 503 is an interface with an external device. The external device includes, for example, a storage medium 503a. Therefore, the computer may read out and/or write to the storage medium 503a via the external I/F 503. The storage medium 503a includes, for example, a flexible disk, a CD, a DVD, a SD memory card, and a USB memory.

The ROM 505 is an example of a non-volatile semiconductor memory (a storage device) capable of retaining a program or data even when the power is turned off. The RAM 504 is an example of a volatile semiconductor memory (a storage device) that temporarily retains a program or data. The CPU 506 is an arithmetic device that reads out a program or data from the storage device such as the ROM 505 or the HDD 508 onto the RAM 504 and executes a processing so as to implement control or functions of the entire computer. The singular point detection and correction device 220 according to the embodiment may implement various processings illustrated in the embodiment, for example, by executing the program of the singular point detection and correction algorithm for the wafer film thickness according to the embodiment in the computer having the hardware configuration.

The hardware configuration of the computer in FIG. 5 is an example, and may be, for example, a smart phone, a tablet terminal, or a distributed processing system including a plurality of computers.

[Functional Block]

Figure 6:
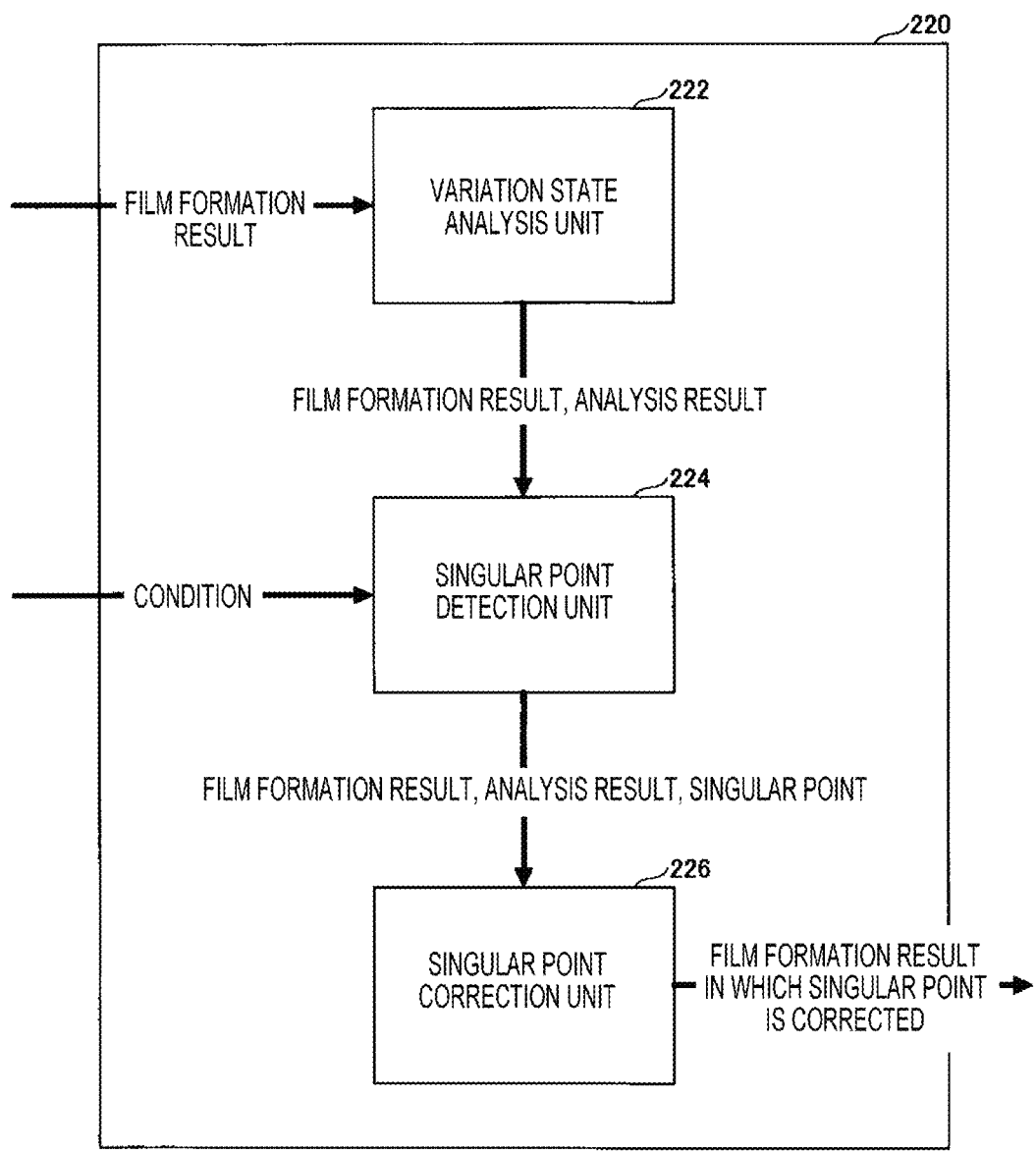
FIG. 6 is a functional block diagram of an example of a singular point detection and correction device according to the present embodiment.

Next, descriptions will be made on functional blocks of the singular point detection and correction device 220 according to the embodiment. FIG. 6 is a functional block diagram of an example of the singular point detection and correction device according to the embodiment. The singular point detection and correction device 220 implements a variation state analysis unit 222, a singular point detection unit 224, and a singular point correction unit 226 by executing the program of the singular point detection and correction algorithm for the wafer film thickness according to the embodiment.

The variation state analysis unit 222 receives a newly formed film formation result. The film formation result includes the coordinates of the measurement point of the monitor wafer and the measurement result of the film thickness of the measurement point. The variation state analysis unit 222 analyzes the variation of the film thickness of the input measurement point. The singular point detection unit 224 detects the singular point based on the analysis result by the variation state analysis unit 222 and conditions such as the coordinates of the column 83 and the support 84.

The singular point correction unit 226 corrects the measurement result of the film thickness of the singular point as will be described later, using a measurement result of the film thickness of another measurement point adjacent to the singular point detected by the singular point detection unit 224. The singular point appearing in the wafer W may be caused by the influence of the column 83 and the support 84, the influence of the underlying oxide film, or other influences. When performing the data analysis or the optimization calculation with the measurement result of the film thickness of the singular point included, the result is likely to be adversely affected. As a result, the singular point correction unit 226 uses the measurement result of the film thickness of another adjacent measurement point to correct so that the measurement result of the film thickness of the detected singular point does not adversely affect the result of the data analysis or the optimization calculation. The singular correction unit 226 outputs the film formation result in which the measurement result of the film thickness of the singular point is corrected.

[Processing]

Hereinafter, descriptions will be made in detail on a processing in which the singular point detection and correction device 220 according to the embodiment detects the singular point of the film thickness of the film formed on the wafer W, and corrects the measurement result of the film thickness of the singular point so that the result of the data analysis and the optimization calculation is not adversely affected. In the following, the singular point due to the influence of the column 83 and the support 84, the singular point due to the influence of the underlying oxide film, and the singular point due to other influences will be separately described.

(Singular Point Due to Influence of Column and Support)

Figure 8B:
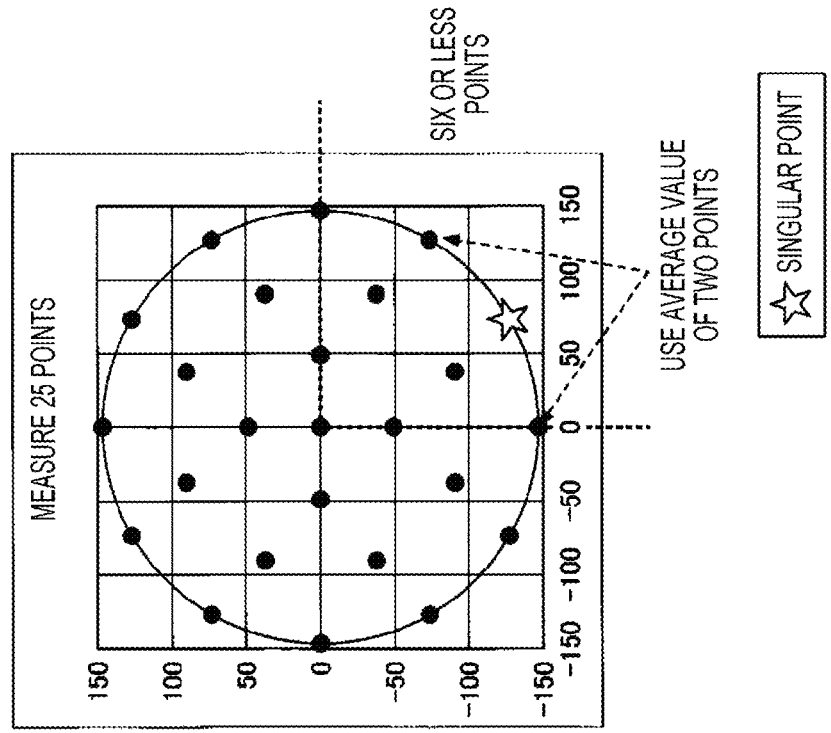
FIGS. 8A and 8B are views for explaining an example of a processing in which the singular point is corrected.
Figure 8A:
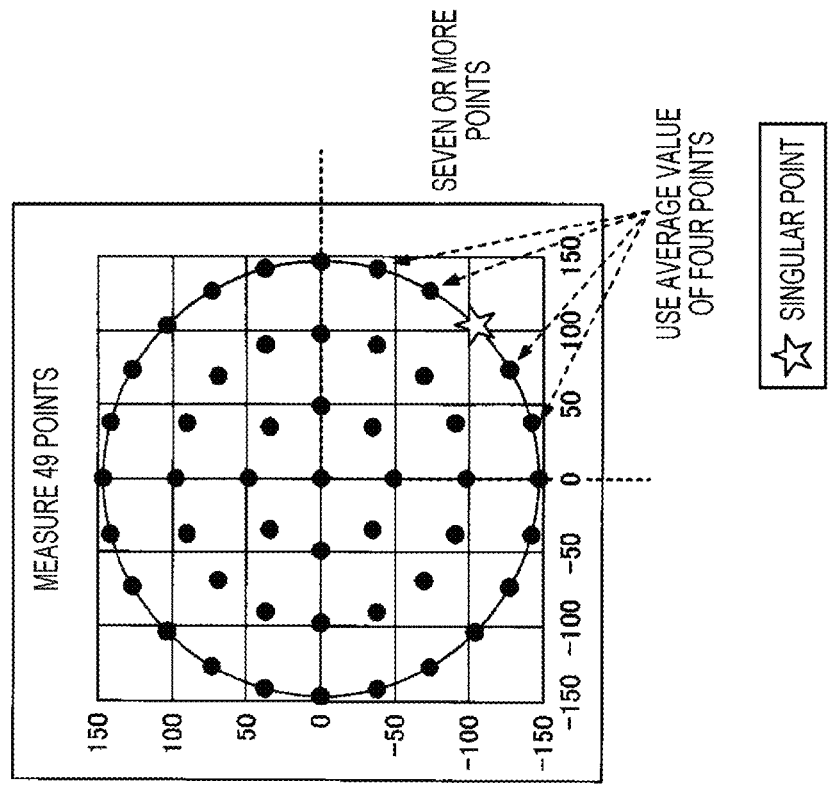

The singular point due to the influence of the column 83 and the support 84 may be detected by using the measurement result of the film thickness of the measurement point in the outer periphery of the wafer W, the coordinates of the measurement point, and the coordinates of the column 83 and the support 84. FIG. 7 is a flow chart of an example of a processing in which the singular point due to the influence of the column and the support is detected, and the singular point is corrected. Further, FIGS. 8A and 8B are views for explaining an example of a processing in which the singular point is corrected.

In step S100, the variation state analysis unit 222 of the singular point detection and correction device 220 receives the coordinates of the measurement point of the wafer W on which a film is newly formed, the measurement result of the film thickness of the measurement point, and the coordinates of the column 83 and the support 84. In step S102, the variation state analysis unit 222 analyzes the variation of the film thickness of the measurement point in the outer periphery as illustrated in FIGS. 9A and 9B, using the measurement result of the film thickness of the measurement point in the outer periphery of the wafer W and the coordinates of the measurement point that are input.

FIGS. 9A and 9B are views for explaining an example of the variation analysis of the film thickness. The variation analysis of the film thickness illustrated in FIGS. 9A and 9B is performed by obtaining the average of the film thickness of the measurement points in the outer periphery (on the concentric circle) of the wafer W, and handling the variation of the film thicknesses of the measurement point as a ratio to the average. With the variation analysis of the film thickness, even when the overall average film thickness is changed due to changes in the control conditions such as the film forming temperature and the film forming time, the variation of the film thickness may be analyzed with the same reference.

In step S104, the singular point detection unit 224 determines whether to correct the singular point due to the influence of the column 83 and the support 84. The determination as to whether to correct the singular point due to the influence of the column 83 and the support 84 may be made, for example, according to an instruction received from an operator. When the singular point due to the influence of the column 83 and the support 84 is not corrected, the processing of the flow chart in FIG. 7 is ended.

When correcting the singular point due to the influence of the column 83 and the support 84, the singular point detection unit 224 selects a measurement point to be a singular point candidate from the coordinates of the column 83 and the support 84. The singular point detection unit 224 determines whether there is a singular point candidate having variation equal to or larger than a predetermined value, based on the result of the variation analysis.

When there is no singular point candidate having variation equal to or larger than a predetermined value, the processing of the flow chart in FIG. 7 is ended. When there is a singular point candidate having variation equal to or larger than a predetermined value, the singular point detection unit 224 detects the singular point candidate having variation equal to or larger than a predetermined value as a singular point. The condition that the variation is equal to or larger than a predetermined value used in the determination in step S106 is an example, and other conditions may be used.

In step S108, as illustrated in FIGS. 8A and 8B, the singular point correction unit 226 determines whether there are seven or more measurement points within a range of ±45° from the central point of the outer periphery of the wafer W. FIG. 8A illustrates an example in which there are seven or more measurement points. FIG. 8B illustrates an example in which there are no seven or more measurement points.

As illustrated in FIG. 8A, when there are seven or more measurement points within a range of ±45° from the central point of the outer periphery of the wafer W, in step S110, the singular point correction unit 226 obtains the average value of four adjacent points on the concentric circle with the singular point using the singular point of the correction target point as a reference. In step S114, the singular point correction unit 226 corrects the singular point by overwriting the singular point with the average value obtained in step S110.

Meanwhile, as illustrated in FIG. 8B, when there are no seven or more measurement points within a range of ±45° from the central point of the outer periphery of the wafer W, in step S112, the singular point correction unit 226 obtains the average value of two adjacent points on the concentric circle with the singular point using the singular point of the correction target point as a reference. In step S114, the singular point correction unit 226 overwrites the singular point with the average value obtained in step S112 to correct the singular point.

(Singular Point Due to Influence of Underlying Oxide Film)

Figure 10:
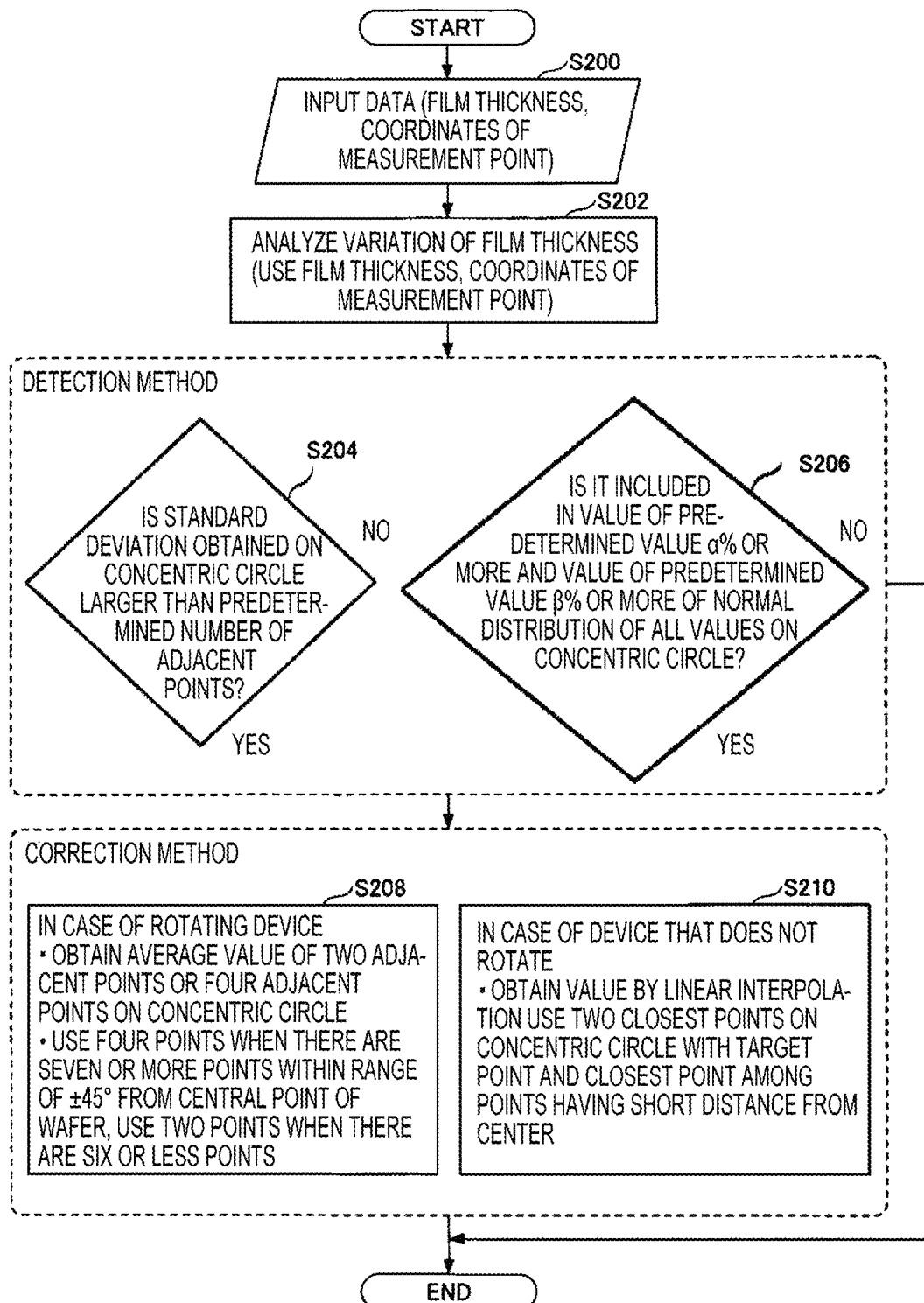
FIG. 10 is a flow chart of an example of a processing in which a singular point due to an influence of an underlying oxide film is detected and the singular point is corrected.
Figure 11B:
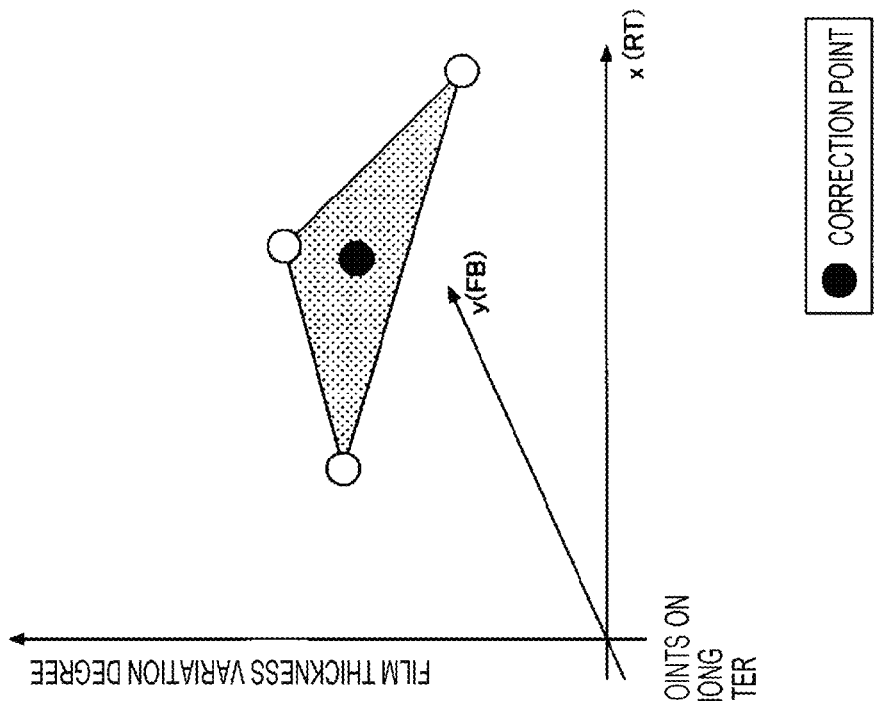
FIGS. 11A and 11B are views for explaining an example of a processing in which a singular point is corrected.
Figure 11A:
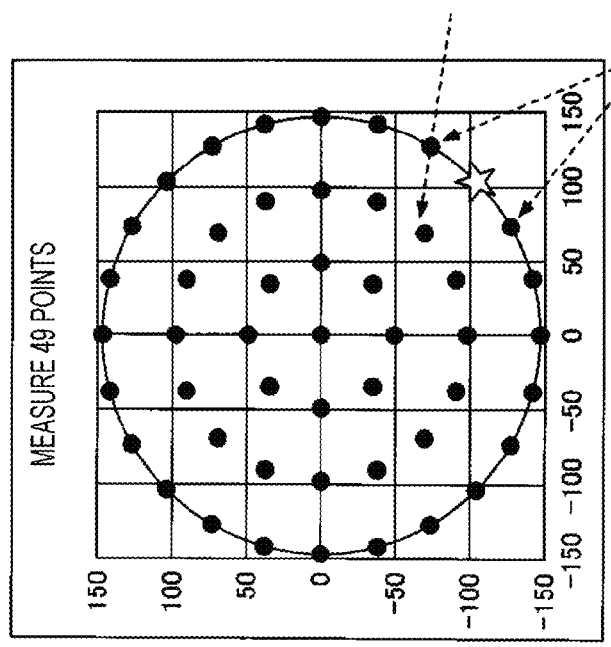

The singular point due to the influence of the underlying oxide film may be suddenly generated independent from the coordinates of the column 83 and the support 84, and thus, is detected by using the measurement result of the measurement point in the outer periphery of the wafer W and the coordinates of the measurement point. FIG. 10 is a flow chart of an example of a processing in which the singular point due to the influence of the underlying oxide film is detected and the singular point is corrected. FIGS. 11A and 11B are views for explaining an example of a processing in which the singular point is corrected.

In step S200, the variation state analysis unit 222 of the singular point detection and correction device 220 receives the coordinates of the measurement point of the wafer W on which a film is newly formed and the measurement result of the film thickness of the measurement point. In step S202, the variation state analysis unit 222 analyzes the variation of the film thickness of the measurement point in the outer periphery by obtaining a standard deviation using the measurement results of the film thickness of the measurement points in the outer periphery of the wafer W and the coordinates of the measurement point that are input. Alternatively, in step S202, the variation state analysis unit 222 analyzes the variation of the film thickness of the measurement point in the outer periphery by obtaining a normal distribution of the measurement points in the outer periphery of the wafer W that are input.

After the processing of step S202, the singular point detection unit 224 detects the singular point by a method of step S204 or a method of step S206.

In step S204, the singular point detection unit 224 determines whether there is a difference of the standard deviation from the measurement results of a predetermined number of adjacent measurement points for each measurement point in the outer periphery of the wafer W. The measurement point having a difference of the standard deviation from the measurement results of a predetermined number of adjacent measurement points is detected as a singular point. The measurement point having no difference of the standard deviation from the measurement results of a predetermined number of adjacent measurement points is not detected as a singular point.

Further, in step S206, the singular point detection unit 224 determines whether each measurement point in the outer periphery of the wafer W is included in a value of a predetermined value α % or more and a value of a predetermined value β% or less (α>β) of the normal distribution of all the measurement points in the outer periphery of the wafer W. The measurement point included in the value of a predetermined value α % or more and the value of a predetermined value β% or less (α>β) of the normal distribution is detected as a singular point.

When the singular point is detected in step S204 or in step S206, the singular point detection unit 226 corrects the singular point by a method of step S208 or a method of step S210.

In a case of the substrate processing apparatus 200 that forms a film by rotating the wafer W, as described with reference to FIGS. 8A and 8B, the singular point correction unit 226 corrects the singular point by overwriting the singular point with the average value obtained from two adjacent points or four adjacent points on the concentric circle with the singular point.

Meanwhile, in a case of the substrate processing apparatus 200 that forms a film without rotating the wafer W, as illustrated in FIG. 11A, the singular point correction unit 226 obtains a value by linear interpolation as illustrated in FIG. 11B using the two adjacent points on the concentric circle with the singular point and one point closest to the singular point among the measurement points having a distance from the center point of the wafer W shorter than that of the singular point. In FIG. 11B, an area that may be linearly illustrated is created using the x and y coordinates of three points and the film thickness. Then, the film thickness is obtained by inputting the position of the singular point. The singular point correction unit 226 corrects the singular point by overwriting the singular point with the obtained value.

(Singular Point Due to Other Influences)

Figure 12B:
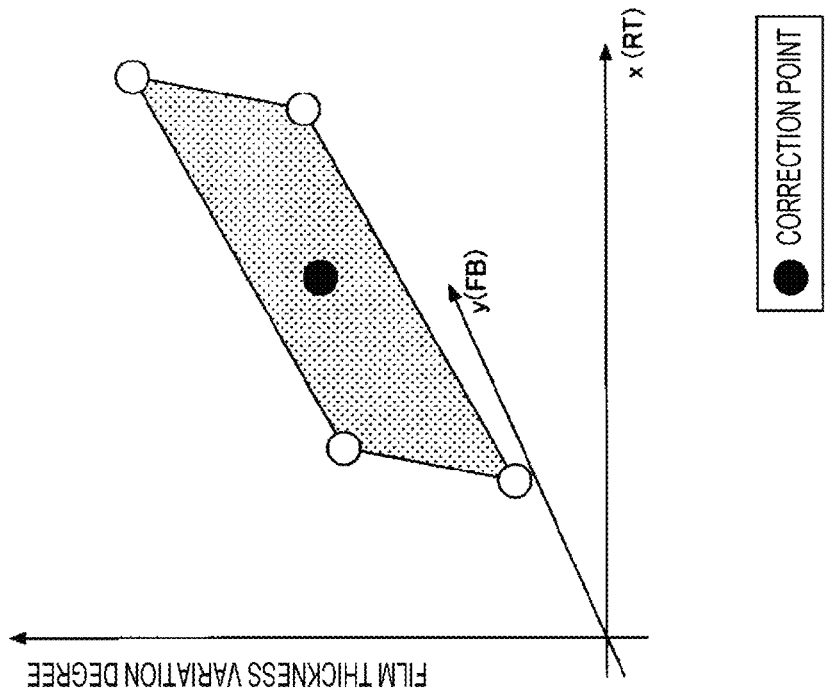
FIGS. 12A and 12B are views for explaining an example of a processing in which a singular point is corrected.
Figure 12A:
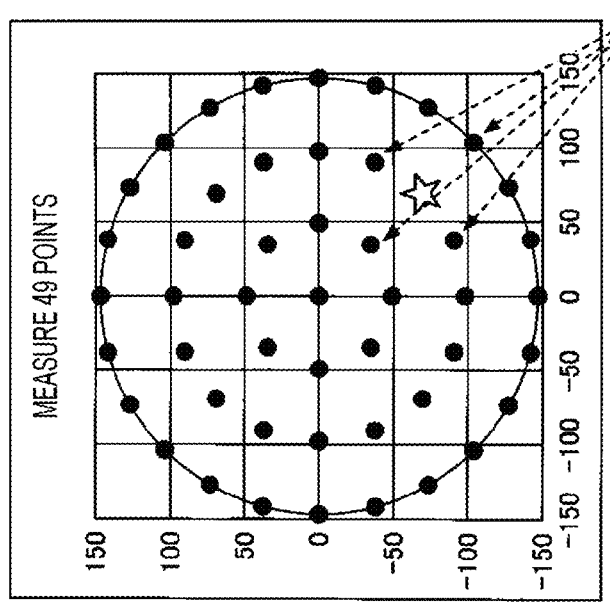

The singular point due to other influences may be detected and corrected by applying the measurement result of the film thickness of the measurement point other than the outer periphery of the wafer W and the coordinates of the measurement to the algorithm described in the detection method and the correction method of the singular point due to the influence of the underlying oxide film. FIGS. 12A and 12B are views for explaining an example of a processing in which the singular point is corrected.

In a case of the substrate processing apparatus 200 that forms a film without rotating the wafer W, as illustrated in FIG. 12A, the singular point correction unit 226 obtains a value by linear interpolation as illustrated in FIG. 12B using the two adjacent points on the concentric circle with the singular point, one point closest to the singular point among the measurement points having a distance from the center point of the wafer W shorter than that of the singular point, and one point closest to the singular point among the measurement points having a distance from the center point of the wafer W longer than that of the singular point. In FIG. 12B, an area that may be linearly illustrated is created using the x and y coordinates of four points and the film thickness. Then, the film thickness is obtained by inputting the position of the singular point. The singular point correction unit 226 corrects the singular point by overwriting the singular point with the obtained value.

SUMMARY

Figure 13A:
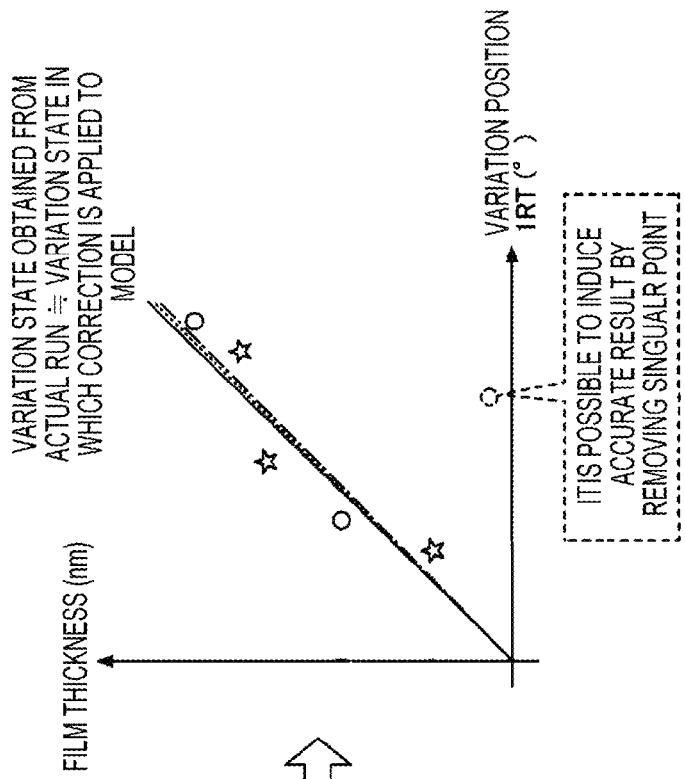
FIGS. 13A and 13B are views illustrating an example of a case where a variation state of a wafer W represented by a model becomes inaccurate due to an influence of an outside (a singular point).
Figure 13B:
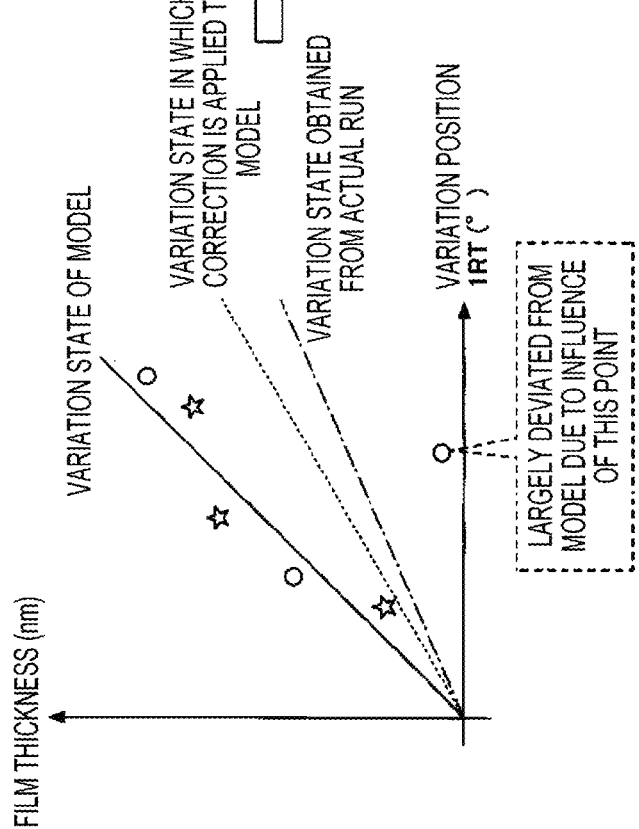

FIGS. 13A and 13B are views illustrating an example of a case where a variation state of a wafer W represented by a model becomes inaccurate due to an influence of an outside (a singular point). In the embodiment, the deviation of the film thickness distribution in which the film thickness is not uniform in the plane (e.g., the edge) of the wafer W is called variation. FIG. 13A illustrates an example in which the variation state obtained from an actual Run is largely deviated from the variation state of the model due to the influence of the singular point. Meanwhile, FIG. 13B illustrates an example in which the variation state obtained from an actual Run is substantially identical with the variation state of the model by removing the singular point detected by the embodiment by correction.

As described above, according to the embodiment, the singular point may be detected by the measurement result of the film thickness formed on the wafer W, and the measurement result of the film thickness of the singular point may be corrected, and thus, the accuracy of the data analysis or the optimization calculation using the measurement result of the film thickness may be improved.

According to the present disclosure, it is possible to detect the singular point from the measurement result of the film thickness formed on the substrate, and correct the measurement result of the film thickness of the singular point.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a memory; and
a processor coupled to the memory and configured to:
measure a film thickness of a film formed on a substrate accommodated in a substrate holder disposed in a processing container, the film thickness being measured by a thickness meter on a plurality of measurement points of the substrate;
analyze variation of the film thickness from a measurement result output from the thickness meter;
detect, based on an analyzed result, a measurement point where a difference of the film thickness with respect to an adjacent measurement point deviates from a first predetermined condition, as a singular point; and
correct a measurement result of the singular point such that the difference of the film thickness between the singular point and the adjacent measurement point is within a second predetermined condition.

2. The substrate processing apparatus according to claim 1, wherein the processor selects a measurement point to be a singular point candidate from coordinates of a column or a support of the substrate holder, and determines the singular point candidate where the difference of the film thickness with respect to the adjacent measurement point deviates from the first predetermined condition, as a singular point.

3. The substrate processing apparatus according to claim 2, wherein the processor corrects the measurement result of the singular point to an average value of adjacent measurement points on a concentric circle of the substrate using the singular point as a reference.

4. An information processing apparatus comprising:
a memory; and
a processor coupled to the memory and configured to:
measure a film thickness of a film formed on a substrate by a thickness meter on a plurality of measurement points of the substrate;
analyze variation of the film thickness from a measurement result output from the thickness meter;
detect, based on an analyzed result, a measurement point where a difference of the film thickness with respect to an adjacent measurement point deviates from a first predetermined condition, as a singular point; and
correct a measurement result of the singular point such that the difference of the film thickness between the singular point and the adjacent measurement point is within a second predetermined condition.

5. The information processing apparatus according to claim 4, wherein the processor obtains a standard deviation using the measurement result of the measurement points in an outer periphery of the substrate, and determines a measurement point where a difference amount of the standard deviation from the measurement result of another adjacent measurement point deviates from the first predetermined condition, as a singular point.

6. The information processing apparatus according to claim 5, wherein the processor corrects the measurement result of the singular point to an average value of adjacent measurement points on a concentric circle of the substrate using the singular point as a reference.

7. The information processing apparatus according to claim 5, wherein the processor corrects the measurement result of the singular point with a value obtained by linear interpolation using a measurement point adjacent to a concentric circle of the substrate based on the singular point, and a measurement point that is closest to the singular point among the measurement points having a shorter distance from a center of the substrate than the singular point.

8. The information processing apparatus according to claim 4, wherein the processor obtains a normal distribution using the measurement result of the measurement points in an outer periphery of the substrate, and determines a measurement point that deviates from the first predetermined condition in the normal distribution, as a singular point.

9. The information processing apparatus according to claim 4, wherein the processor obtains a standard deviation using the measurement result of the measurement points in a portion other than an outer periphery of the substrate, and determines a measurement point where a difference amount of the standard deviation from the measurement result of another adjacent measurement point deviates from the first predetermined condition, as a singular point.

10. The information processing apparatus according to claim 9, wherein the processor corrects the measurement result of the singular point to an average value of adjacent measurement points on a concentric circle of the substrate using the singular point as a reference.

11. The information processing apparatus according to claim 9, wherein the processor corrects the measurement result of the singular point with a value obtained by linear interpolation using a measurement point adjacent to a concentric circle of the substrate based on the singular point, and a measurement point that is closest to the singular point among the measurement points having a shorter distance from a center of the substrate than the singular point.

12. The information processing apparatus according to claim 4, wherein the processor obtains a normal distribution using the measurement result of the measurement points in a portion other than an outer periphery of the substrate, and determines a measurement point deviating from the first predetermined condition in the normal distribution, as a singular point.

13. An information processing apparatus comprising:
a memory; and
a processor coupled to the memory and configured to:
measure a film thickness of a film formed on a substrate by a thickness meter on a plurality of measurement points of the substrate;
analyze variation of the film thickness from a measurement result output from the thickness meter;
detect, based on an analyzed result, a measurement point where a difference of the film thickness with respect to an adjacent measurement point deviates from a first predetermined condition, as a singular point, and not detect the singular point when there exist only adjacent measurement points where the difference of the film thickness is within the first predetermined condition; and
correct a measurement result of the singular point so that the difference of the film thickness between the singular point and the adjacent measurement point is within a second predetermined condition.

* * * * *